US012690495B2

(12) United States Patent
Gong et al.

(10) Patent No.: US 12,690,495 B2
(45) Date of Patent: Jul. 21, 2026

(54) PACKAGE STRUCTURE FOR POWER SEMICONDUCTOR DEVICES WITH IMPROVED PARASITIC PARAMETERS

(71) Applicants: Nexperia Technology (Shanghai) Ltd., Shanghai (CN); NEXPERIA B.V., Nijmegen (NL)

(72) Inventors: Wei Gong, Shanghai (CN); Chunlin Zhu, Shanghai (CN); Ke Jiang, Shanghai (CN)

(73) Assignees: Nexperia Technology (Shanghai) Ltd., Shanghai (CN); Nexperia B.V., Nijmegen (NL)

( * ) Notice: Subject to any disclaimer, the term of this patent is extended or adjusted under 35 U.S.C. 154(b) by 539 days.

(21) Appl. No.: 18/296,433

(22) Filed: Apr. 6, 2023

(65) Prior Publication Data

US 2023/0326907 A1 Oct. 12, 2023

(30) Foreign Application Priority Data

Apr. 8, 2022 (CN) ......................... 202210365853.X

(51) Int. Cl.
| | |
|---|---|
| *H10W 72/90* | (2026.01) |
| *H10W 40/00* | (2026.01) |
| *H10W 70/65* | (2026.01) |
| *H10W 90/00* | (2026.01) |
| *H10W 72/00* | (2026.01) |
| *H10W 72/50* | (2026.01) |
| *H10W 72/60* | (2026.01) |

(52) U.S. Cl.
CPC ........... *H10W 90/00* (2026.01); *H10W 40/00* (2026.01); *H10W 70/65* (2026.01); *H10W 90/701* (2026.01); *H10W 72/5475* (2026.01); *H10W 72/631* (2026.01); *H10W 72/652*

(2026.01); *H10W 72/871* (2026.01); *H10W 72/926* (2026.01); *H10W 72/944* (2026.01); *H10W 90/754* (2026.01); *H10W 90/763* (2026.01)

(58) Field of Classification Search
CPC ........ H10K 65/00; H10K 30/20; H10K 30/30; H10K 39/34; H10K 85/311; H10K 85/322; H10K 85/371; H10K 85/624; H10K 39/32; H10K 85/211; H10K 2102/351; H10K 30/40; H10K 30/80; H10K 85/324; H10K 85/633; H10K 85/6572; Y02E 10/549; H10F 39/198
See application file for complete search history.

(56) References Cited

U.S. PATENT DOCUMENTS

2017/0018484 A1* 1/2017 Kadoguchi ......... H01L 21/4825
2020/0395322 A1* 12/2020 McPherson ........... H01L 25/072

* cited by examiner

*Primary Examiner* — Elias Ullah
(74) *Attorney, Agent, or Firm* — Ruggiero McAllister & McMahon LLC

(57) ABSTRACT

A package structure for a power semiconductor device is provided, including: a substrate; two or more semiconductor dies on the substrate, each of the semiconductor dies includes a first power switching pad, a second power switching pad and a gate; a gate control conductive trace, a first power switching contact and a second power switching contact are further arranged on the substrate, the gate control conductive trace is connected to each of the semiconductor dies via a bonding component, and the bonding component connecting a first semiconductor die to the gate control conductive trace is sandwiched between circuit lines formed by connecting the second power switching pads of the first semiconductor die and the neighboring second semiconductor die, to second power switching contact of the substrate.

19 Claims, 10 Drawing Sheets

PACKAGE STRUCTURE FOR POWER SEMICONDUCTOR DEVICES WITH IMPROVED PARASITIC PARAMETERS

CROSS-REFERENCE TO RELATED APPLICATIONS

This application claims the benefit under 35 U.S.C. § 119(a) of Chinese Application No. 202210365853.X filed Apr. 8, 2022, the contents of which are incorporated by reference herein in their entirety.

BACKGROUND

1. Field of the Disclosure

The present disclosure relates to a package structure for power semiconductor devices. In particular, the present disclosure relates to a package structure for power semiconductor devices with improved parasitic parameters.

2. Description of the Related Art

The demand for power control in an inverter power module of an electric vehicle or in a power module of an intelligent appliance has increased significantly. Power semiconductor devices such as MOSFET (Metal Oxide Semiconductor Field Effect Transistor), HEMT (High Electron Mobility Transistor), IGBT (Insulated Gate control Bipolar Transistor) are core components in the field of industrial control and automation. These devices adjust voltage, current and the like in a circuit through signal instructions to achieve accurate regulation, ensure normal operation of electronic products and electrical facilities while reducing voltage loss, so that the devices could achieve energy saving and high efficiency.

The power capacity of the semiconductor device could be further expanded by connecting a plurality of semiconductor dies in parallel. However, in the prior art, the parallel power semiconductor dies have different control loop lengths, which result in different electrical impedances (or parasitic parameters), thus could cause the problem of desynchronized switching or imbalanced current on the parallel dies easily. Secondly, the position of the conductive trace in the prior art occupies most of the space of the semiconductor substrate, so that the space utilization rate of the semiconductor substrate is not sufficiently high. In addition, for semiconductor dies, high frequency signals are increasingly used. However, high frequency signals are often accompanied by the problem of signal integrity and electromagnetic wave shielding, and the Electromagnetic Interference (EMI) characteristics in the prior art needs to be improved.

FIG. 1 shows a top view of a prior art package structure for a power electronic device. As shown in FIG. 1, two gates 32 on two semiconductor dies are connected to the gate control conductive trace 24 via two leads 34, respectively. In addition, one of the leads 34 is connected to the gate contact 20. The gate control conductive trace 24 is located on the lower part of the semiconductor substrate and occupies almost all of the lower part portion. The control loops of the parallel dies of the package in FIG. 1 have different electrical impedances. Furthermore, the arrangement of the gate control conductive trace 24 wastes the space on the substrate.

FIG. 2 shows a top view of another prior art package structure. As shown in FIG. 2, two gates 60 on two semiconductor dies 54 are connected to the gate control conductive trace 50 via two leads 68, respectively. Two Kelvin connection pads 62 are connected to the Kelvin conductive trace 52 via two leads 68, respectively, and the gate control conductive trace 50 and the Kelvin conductive trace 52 are respectively provided to have at least one edge that is not parallel to the edge of the power supply substrate 38. The anti-EMI characteristics of this prior art package may not be sufficient, leading to desynchronized switching or imbalanced current on the parallel dies. In addition, such an arrangement of the gate control conductive trace 50 and the Kelvin conductive trace 52 makes space utilization rate on the substrate low.

SUMMARY

The present disclosure discloses a package structure for a power semiconductor device, comprising: a substrate; two or more semiconductor dies on the substrate, each of the semiconductor dies comprises a first power switching pad, a second power switching pad and a gate; a gate control conductive trace, a first power switching contact and a second power switching contact are further disposed on the substrate, the gate control conductive trace is connected to each of the semiconductor dies via a bonding component, wherein the bonding component connecting the first semiconductor die to the gate control conductive trace is sandwiched between circuit lines formed by connecting the second power switching pads of the first semiconductor die and the neighboring second semiconductor die, to the second power switching contact of the substrate.

As an embodiment of the present disclosure, the bonding component is a bonding wire.

As an embodiment of the present disclosure, the bonding component is copper clip.

As an embodiment of the present disclosure, a Kelvin conductive trace is disposed on the substrate, and the bonding component connecting the first semiconductor die to the gate control conductive trace and the Kelvin conductive trace is sandwiched between circuit lines formed by connecting the second power switching pads of the first semiconductor die and the neighboring second semiconductor die, to the second power switching contact of the substrate.

As an embodiment of the present disclosure, each of the semiconductor dies further comprises a Kelvin connection pad, the gate and the Kelvin connection pad of each of the semiconductor dies are connected to the gate control conductive trace and the Kelvin conductive trace, respectively.

As an embodiment of the present disclosure, the Kelvin conductive trace is connected to the second power switching pad of each of the semiconductor dies via the bonding component.

As an embodiment of the present disclosure, the gate control conductive trace is enclosed by the Kelvin conductive trace, or the Kelvin conductive trace is enclosed by the gate control conductive trace.

As an embodiment of the present disclosure, the gate control conductive trace is located between the semiconductor die and the Kelvin conductive trace, or the Kelvin conductive trace is located between the semiconductor die and the gate control conductive trace.

As an embodiment of the present disclosure, a Kelvin contact is disposed on the substrate as an integral component with the second power switching contact.

As an embodiment of the present disclosure, a temperature sensor is further disposed on the substrate, the temperature sensor and the semiconductor die are located on the same layer.

As an embodiment of the present disclosure, when only two semiconductor dies are located on the substrate, the gates of the two semiconductor dies are disposed at edges of two neighboring sides of the two semiconductor dies respectively.

As an embodiment of the present disclosure, the connection mode of the second power switching pad of each of the semiconductor dies to the second power switching contact of the substrate comprises bonding wire connection or metal contact.

As an embodiment of the present disclosure, the first power switching pad is a drain or a receiver electrode, and the second power switching pad is a source or an emitter.

As an embodiment of the present disclosure, the first power switching contact is a drain contact, and the second power switching contact is a source contact.

The present disclosure further discloses a package structure for a power semiconductor device, comprising: a substrate, two or more semiconductor dies on the substrate, each of the semiconductor dies comprises a first power switching pad, a second power switching pad and a gate; a gate control conductive trace, a Kelvin conductive trace, a first power switching contact and a second power switching contact are further disposed on the substrate, wherein the gate control conductive trace is enclosed by the Kelvin conductive trace, or the Kelvin conductive trace is enclosed by the gate control conductive trace.

As an embodiment of the present disclosure, a temperature sensor is further disposed on the substrate, the temperature sensor and the semiconductor die are located on the same layer.

As an embodiment of the present disclosure, the semiconductor die comprises IGBT die, SiC die or GaN die.

DETAILED DESCRIPTION

In order for a person skilled in the art to better understand the technical solutions of the present disclosure, as non-limiting examples, the package structure for the power semiconductor devices with improved parasitic parameters provided in the present disclosure will be described in detail below in conjunction with the accompanying drawings. It should also be noted that for the purpose of explaining these exemplary embodiments herein, the views show the general features of the methods and devices of the exemplary embodiments in the present disclosure. However, these views are not to scale and may not precisely reflect the features of any given embodiment, and should not be interpreted as defining or limiting the numerical ranges or features of the exemplary embodiments within the scope of the present disclosure.

Figure 3:
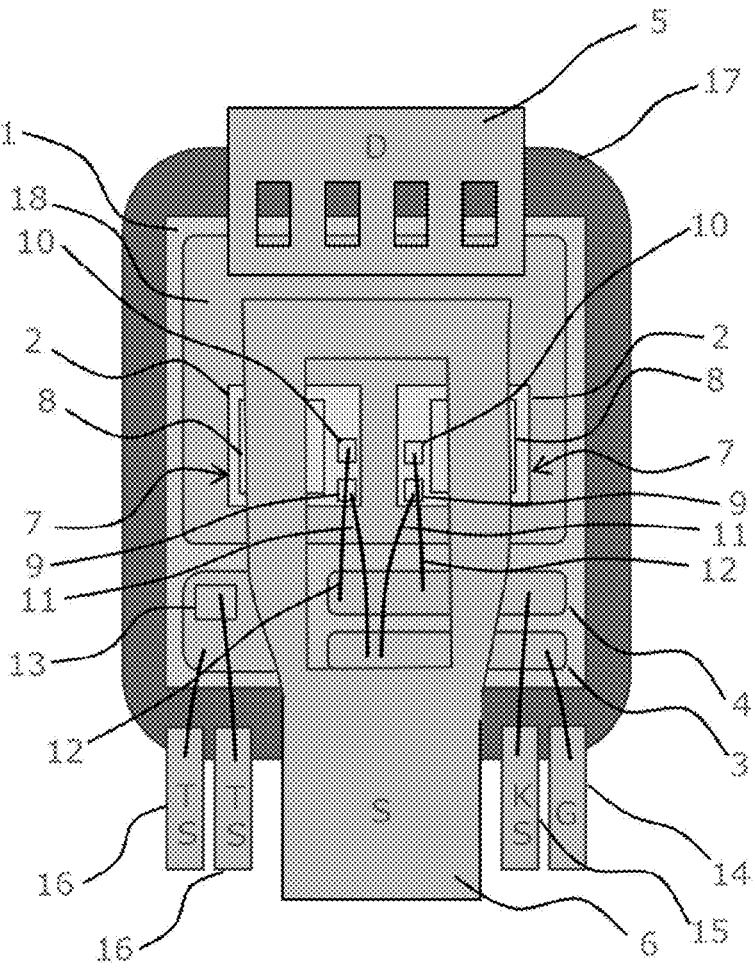
FIG. 3 shows a top view of a package structure for a power semiconductor device in one embodiment of the present disclosure.

FIG. 3 shows a top view of a package structure of a power semiconductor device of the present disclosure. As shown in FIG. 3, the package structure of the power semiconductor device comprises: a substrate 1, two semiconductor dies 2 on the substrate 1, each semiconductor die 2 comprises a first power switching pad 7, a second power switching pad 8, a gate 9 and a Kelvin connection pad 10. The substrate 1 further comprises a power switching conductive trace 18, a gate control conductive trace 3 and a Kelvin conductive trace 4, each of which is separated from one another by insulating materials, so that the power switching conductive trace 18, the gate control conductive trace 3 and the Kelvin conductive trace 4 are electrically insulated from one another. FIG. 3 shows that two semiconductor dies 2 are on the power switching conductive trace 18 of the substrate 1, such that the first power switching pad 7 on each semiconductor die 2 is electrically coupled to the power switching conductive trace 18. The substrate 1 further comprises a first power switching contact 5 and a second power switching contact 6. The first power switching contact is attached to the power switching conductive trace 18 by direct contact and thereby electrically coupled to the first power switching pad 7, and the second power switching contact 6 is attached to the second power switching pad 8 of each semiconductor die 2 by direct contact. Direct contact attachment could be accomplished using sintered metal (e.g. copper metal, silver metal), or soldering, etc. The gate control conductive trace 3 and the Kelvin conductive trace 4 are respectively connected to the gate 9 and the Kelvin connection pad 10 of each semiconductor die 2 via a bonding component. The bonding component could be one or more bonding wires, or one or more copper clips (not shown in the drawings). As one example, the gate control conductive trace 3 and the Kelvin conductive trace 4 shown in FIG. 3 are connected to the gate 9 and the Kelvin connection pad 10 of each of the two semiconductor dies 2 via one or more bonding wires 11, 12 (typically one). The bonding component connecting each semiconductor die 2 to the gate control conductive trace 3 and the Kelvin conductive trace 4 is sandwiched between circuit lines formed by the second power switching pads 8 of the two semiconductor dies 2 and the copper sheet of the second power switching contact 6. As one example, FIG. 3 shows that the bonding wires 11, 12 connecting each semiconductor die 2 to the gate control conductive trace 3 and the Kelvin conductive trace 4 are sandwiched between circuit lines formed by the second power switching pads 8 of the two semiconductor dies 2 and the copper sheet of the second power switching contact 6.

When copper clips are used as the bonding component, two ends of the copper clip are correspondingly placed at corresponding positions of the gate and the gate control conductive trace of the semiconductor die, and the Kelvin connection pad and the Kelvin conductive trace of the semiconductor die. The metal on the surface of the die and the conductive trace could be effectively bonded to a welding or sintered material through high-temperature welding or sintering. By way of copper clip bonding, the purpose of bonding and connecting the semiconductor die to the corresponding conductive trace could be achieved, meanwhile the problems of wire floating and breakage of welding spots could be reduced, and the reliability of products could be improved.

The following exemplary embodiment shows a case where the bonding component uses bonding wire for connection. It should be appreciated that the bonding wire could be replaced with copper clip.

In the example shown in FIG. 3, two gates 9 of the two semiconductor dies 2 are located at the edges of two neighboring sides of the two semiconductor dies 2.

As shown in FIG. 3, the frame structure of the second power switching contact 6 couples the two second power switching pads 8 on the two semiconductor dies 2 to the second power switching contact 6, respectively, forming two circuit lines. The bonding wires 11, 12 connecting each semiconductor die 2 to the gate control conductive trace 3 and the Kelvin conductive trace 4 are sandwiched between two circuit lines formed by the second power switching pad 8 of each semiconductor die 2 and the second power switching contact 6, so that the two parallel semiconductor dies have substantially the same control loop length, so that the electrical impedances of the parallel dies are substantially the same, thereby achieving balanced switching/current on the parallel dies. The length of the bonding wires 11, 12 for connecting the semiconductor die 2 to the gate control conductive trace 3 could be designed to be suitable length according to circuit requirements. It should be appreciated that when the bonding component uses one or more clips bonding, the clips could also be dimensioned appropriately according to the circuit requirements.

The above "control loop length" means the loop length where the gate signal contact 14 is connected to the gate control conductive trace 3 by the bonding component, the gate control conductive trace 3 is connected to the gate 9 by the bonding component, the gate 9 is connected to the Kelvin connection pad 10, the Kelvin connection pad 10 is connected to the Kelvin conductive trace 4 by the bonding component, and the Kelvin conductive trace 4 is connected to the Kelvin terminal 15 by the bonding component.

Since the Kelvin contact 15 and the gate contact 14 are located on the same side of the substrate, the proximity of the gates 9 and the Kelvin connection pads 10 of the two semiconductor dies could make the trace lengths of the two semiconductor dies in the control loop substantially the same.

It should be appreciated that the semiconductor die 2 could be IGBT die, SiC die, or GaN die; the shape of the semiconductor die 2 can be square or rectangular, but is not limited thereto.

Wherein, the first power switching pad 7 is a drain or a collector, the second power switching pad 8 is a source or an emitter, the first power switching contact 5 is a drain or collector contact, and the second power switching contact 6 is a source or emitter contact.

The Kelvin conductive trace 4 shown in FIG. 3 is located between the semiconductor die 2 and the gate control conductive trace 3, the Kelvin conductive trace 4 and the gate control conductive trace 3 are substantially parallel, and the Kelvin conductive trace 4 and the gate control conductive trace 3 are substantially parallel to the semiconductor die 2 on the substrate 1.

Figure 4:
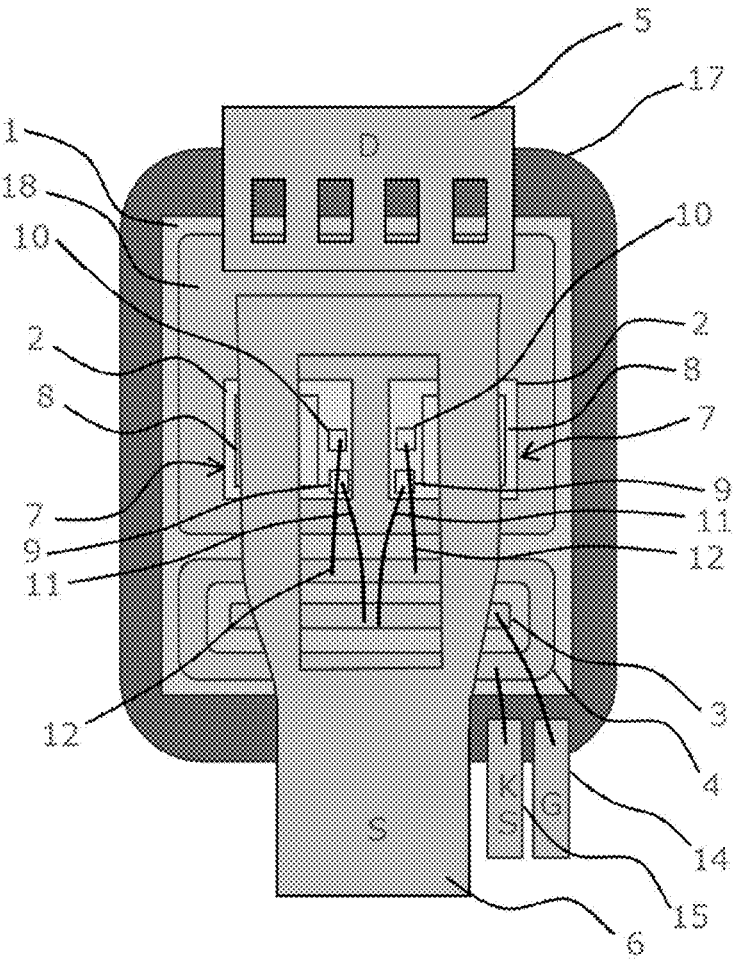
FIG. 4 shows a top view of a package structure for a power semiconductor device in another embodiment of the present disclosure.

FIG. 4 shows a top view of another package structure of a power semiconductor device of the present disclosure. As shown in FIG. 4, the gate control conductive trace 3 is enclosed by the Kelvin conductive trace 4, wherein the gate control conductive trace 3 is substantially parallel to the Kelvin conductive trace 4, and the Kelvin conductive trace 4 and the gate control conductive trace 3 are substantially parallel to the semiconductor die 2 on the substrate 1. Such a surrounding arrangement of the Kelvin conductive trace 4 could reduce the electromagnetic interference on the gate control conductive trace 3. Although not shown in FIG. 4, the Kelvin conductive trace 4 could also be arranged to be enclosed by the gate control conductive trace 3, and such a surrounding arrangement of the gate control conductive trace 3 could reduce the electromagnetic interference on the Kelvin conductive trace 4.

Figure 9:
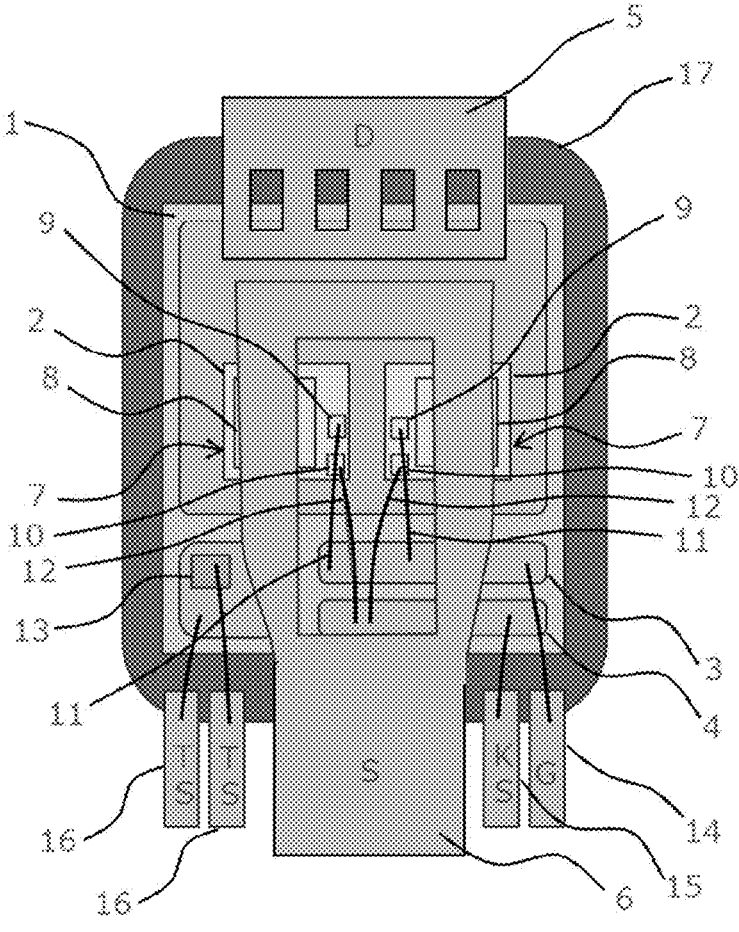
FIG. 9 shows a top view of a package structure for a power semiconductor device in another embodiment of the present disclosure.

The present disclosure is certainly not limited to the above arrangements. The gate control conductive trace 3 could also be located between the semiconductor die 2 and the Kelvin conductive trace 4 (as shown in FIG. 9). As an arrangement shown in FIG. 9, the Kelvin conductive trace 4 and the gate control conductive trace 3 are substantially parallel, and the Kelvin conductive trace 4 and the gate control conductive trace 3 are substantially parallel to the semiconductor die 2 on the substrate 1.

Figure 5:
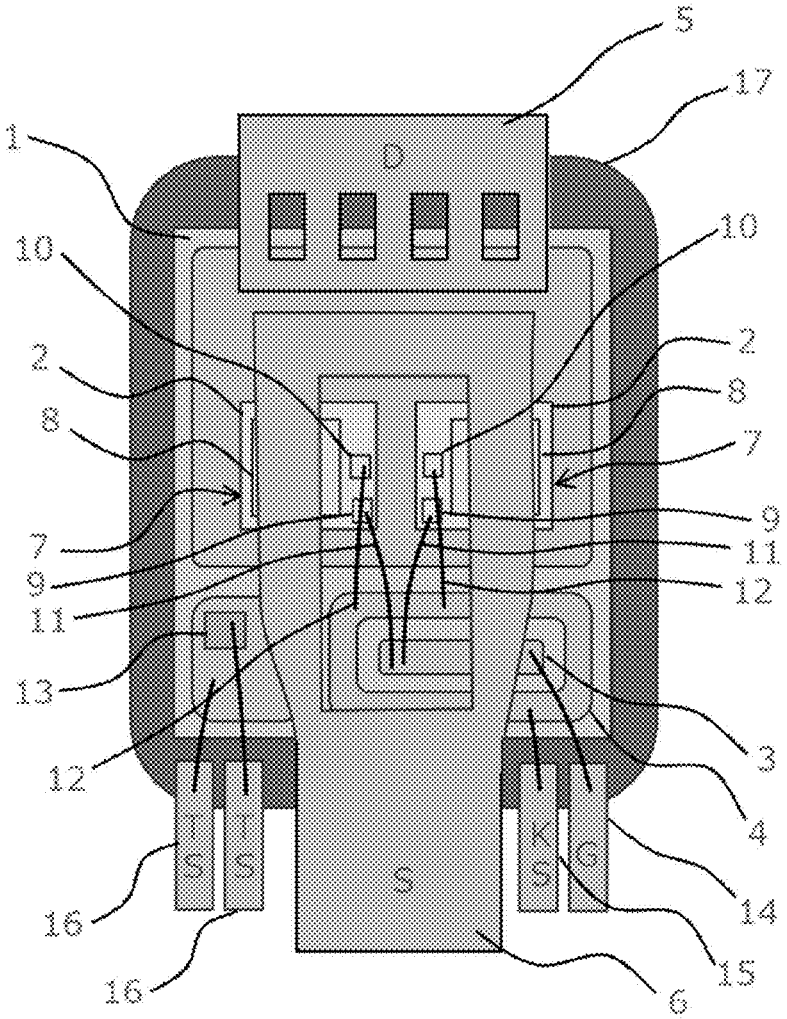
FIG. 5 shows a top view of a package structure for a power semiconductor device in another embodiment of the present disclosure.

FIG. 5 shows a top view of another package structure of a power semiconductor device of the present disclosure. As shown in FIG. 5, the gate control conductive trace 3 of the power semiconductor device package is enclosed by the Kelvin conductive trace 4. Such layout could save space on the substrate 1, and a temperature sensor 13 is further disposed in the remaining area of the substrate 1. The current of the power module due to parallel dies could reach or exceed 1200 A, with the maximum working temperature of 250° C. Therefore, the arrangement of the temperature sensor 13 on the substrate 1 could monitor temperature change of the device such that the device can achieve rapid heat dissipation, and the service life of the device could be improved. The temperature sensor 13 could be connected to the substrate using a soldering or sintering process, the temperature sensor and the semiconductor die are located on the same layer, and anode and cathode of the temperature sensor 13 are connected to two signal contacts 16 of the temperature sensor via bonding wires.

An NTC temperature sensor or a PTC temperature sensor could be used. A thermistor temperature sensor is typically temperature sensitive and exhibits different resistance values at different temperatures. The higher the temperature, the larger resistance value the positive temperature coefficient thermistor. Further, the higher the temperature, the lower resistance value the negative temperature coefficient thermistor. With the characteristics that the resistance values of the thermistor change under certain measurement power, the thermistor temperature sensor could determine the corresponding temperature by measuring the resistance value thereof, thereby achieving the purpose of detecting and controlling the temperature.

It should be noted that the temperature sensor 13 is not only arranged on the substrate 1 where the gate control conductive trace 3 is enclosed by the Kelvin conductive trace 4, but also could be arranged in the remaining area of the substrate 1 when the gate control conductive trace 3 is located between the semiconductor die 2 and the Kelvin conductive trace 4, or the Kelvin conductive trace 4 is located between the semiconductor die 2 and the gate control conductive trace 3.

Figure 6:
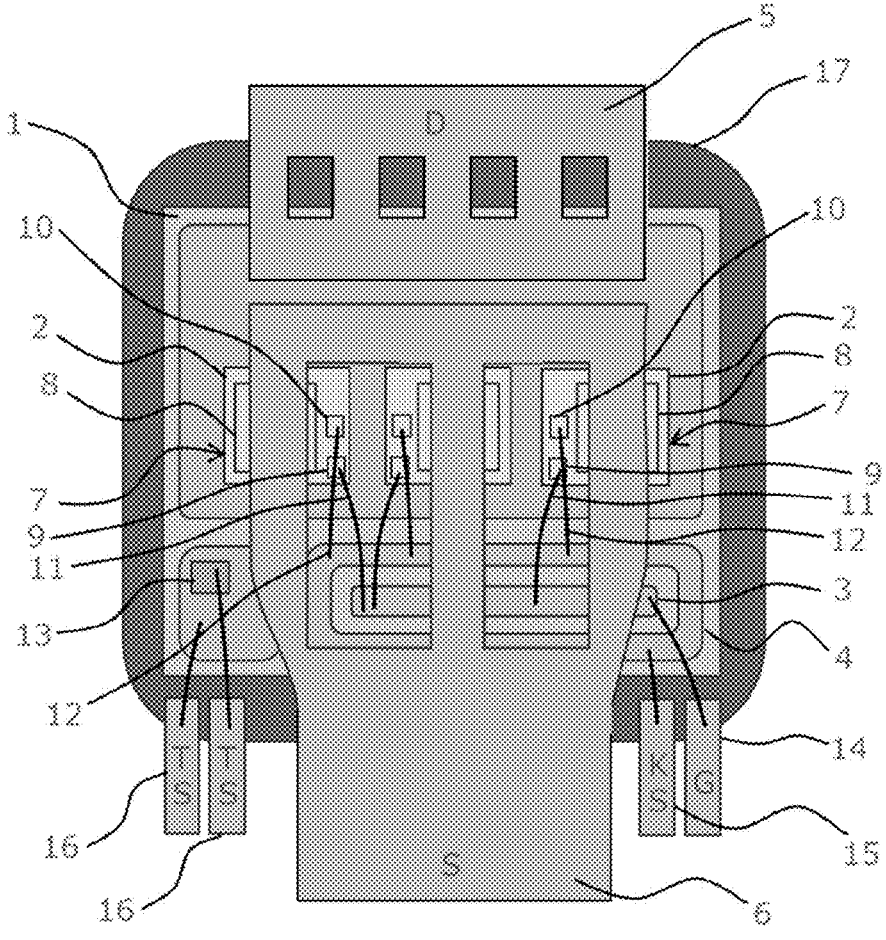
FIG. 6 shows a top view of a package structure for a power semiconductor device in another embodiment of the present disclosure.

FIG. 6 shows a top view of a package structure for a power semiconductor device according to another embodiment of the present disclosure. As shown in FIG. 6, the semiconductor device package has three power semiconductor dies 2, which are die A, die B, and die C (not shown in the figure) from left to right. Dies A and B are connected to the bonding components of the gate control conductive trace 3 and the Kelvin conductive trace 4. For example, the bonding wires 11 and 12 are sandwiched between the circuit lines formed by the second power switching pads 8 of dies A and B and the second power switching contact 6, two gates 9 of dies A and B are located at the edges of the two neighboring sides of dies A and B. The bonding components (e.g. bonding wires 11, 12) connecting die C to the gate control conductive trace 3 and the Kelvin conductive trace 4 are sandwiched between the circuit lines formed by the second power switching pads 8 of dies B and C and the second power switching contact 6.

Figure 7:
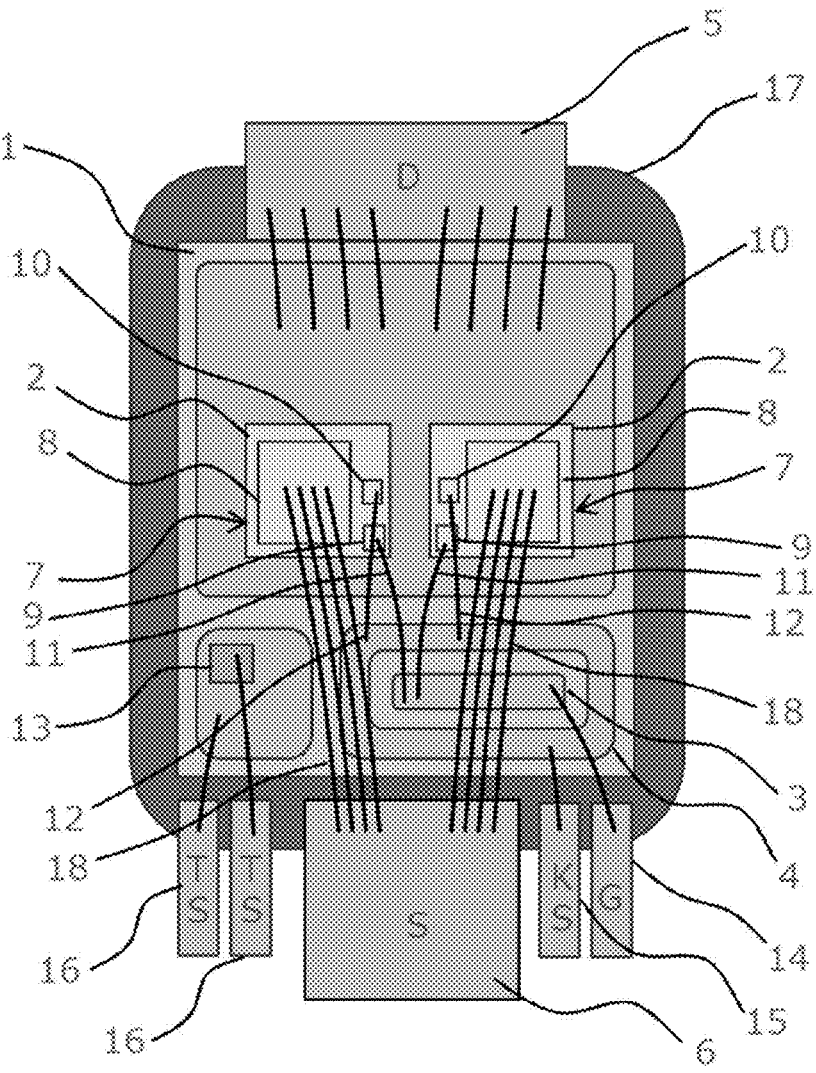
FIG. 7 shows a top view of a package structure for a power semiconductor device in another embodiment of the present disclosure.

FIG. 7 shows a top view of a package structure for a power semiconductor device according to another embodiment of the present disclosure, wherein the second power switching contact 6 is not directly attached to the second power switching pad 8 of each semiconductor die 2, but is connected to the second power switching pad 8 via the bonding wires. The bonding components (e.g. bonding wires 11, 12) connecting each semiconductor die 2 to the gate control conductive trace 3 and the Kelvin conductive trace 4 are sandwiched between the bonding wires of the second power switching pads 8 of the two semiconductor dies 2 and the second power switching contact 6. Further, the two gates 9 of the two semiconductor dies 2 are located at the edges of the two neighboring sides of the two semiconductor dies 2.

Figure 8:
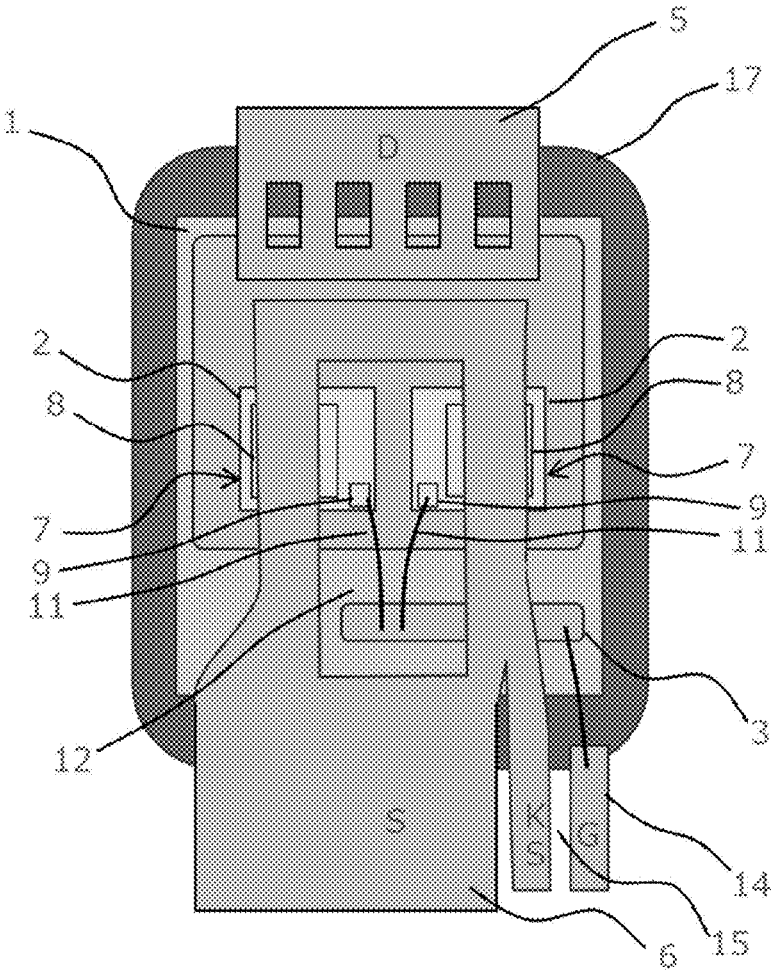
FIG. 8 shows a top view of a package structure for a power semiconductor device in another embodiment of the present disclosure.

FIG. 8 is a top view of a package structure for a power semiconductor device according to another embodiment of the present disclosure. As shown in FIG. 8, the substrate 1 is not provided with a Kelvin conductive trace 4. Instead, the second power switching contact 6 and the Kelvin contact 15 are designed as an integral piece. By adopting this new package, the structure could be simplified, the manufacturing cost could be reduced, and the device performance could be further improved.

In FIG. 8, the bonding component (e.g. bonding wire 11) connecting each semiconductor die 2 to the gate control conductive trace 3 is sandwiched between circuit lines formed by the second power switching pads 8 of the two semiconductor dies 2 and the copper sheet of the second power switching contact 6. The gates 9 are arranged at edges of two neighboring sides of the two semiconductor dies 2. It should be noted that the semiconductor die 2 shown in FIG. 8 is not provided with a Kelvin connection pad 10, therefore, the Kelvin terminal 15 is in direct contact with the second power switching pad 8 on the semiconductor die 2.

FIG. 9 shows a top view of a package structure for a power semiconductor device according to another embodiment of the present disclosure, wherein the gate control conductive trace 3 is located between the semiconductor die 2 and the Kelvin conductive trace 4. The bonding component (e.g. bonding wire 11) connecting each semiconductor die 2 to the gate control conductive trace 3 and the Kelvin conductive trace 4 is sandwiched between circuit lines formed by the second power switching pads 8 of the two semiconductor dies 2 and the copper sheet of the second power switching contact 6. The gates 9 are arranged at the edges of two neighboring sides of the semiconductor dies 2. A temperature sensor 13 is further arranged in the remaining area of the substrate 1.

A package structure for a power semiconductor device with improved parasitic parameters of this disclosure further comprises a plastic molding package or a plastic enclosure 17 package.

Figure 10:
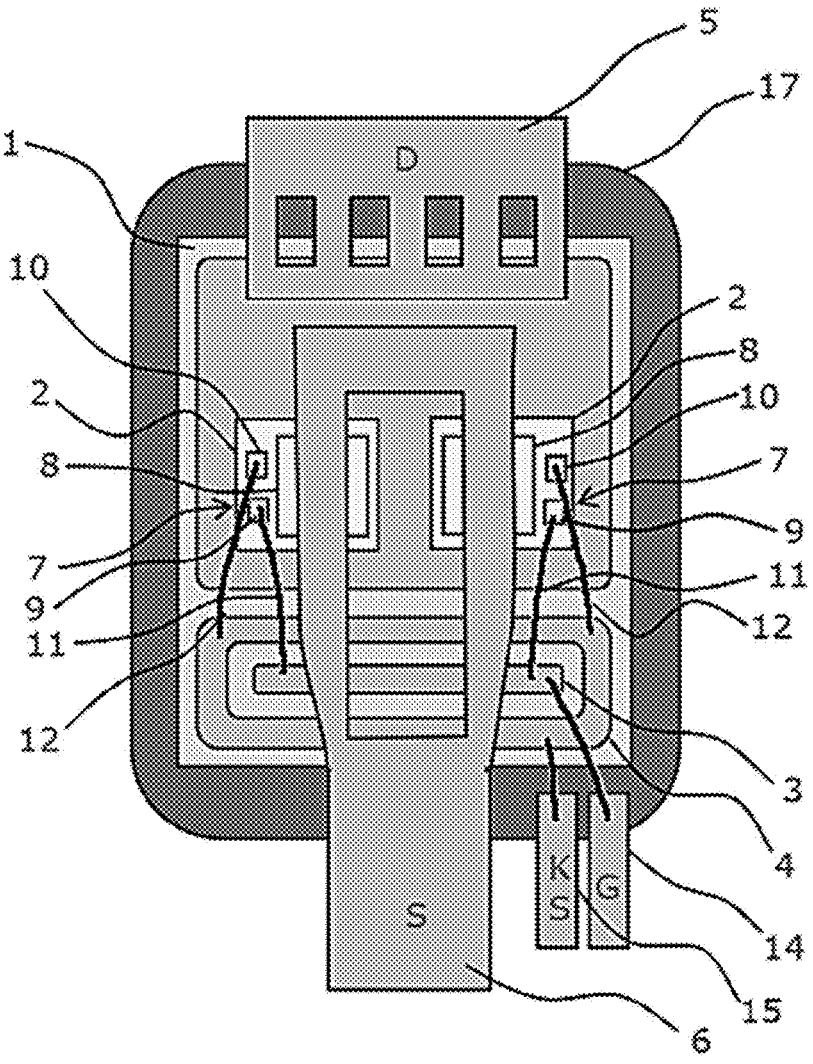
FIG. 10 shows a top view of a package structure for a power semiconductor device in another embodiment of the present disclosure.

FIG. 10 shows a top view of another package structure for the power semiconductor device of the present disclosure. As shown in FIG. 10, the package structure of the power semiconductor device comprises: a substrate 1, two semiconductor dies 2 on the substrate 1, each semiconductor die 2 comprises a first power switching pad 7, a second power switching pad 8, a gate 9 and a Kelvin connection pad 10. A gate control conductive trace 3 and a Kelvin conductive trace 4 are arranged on the substrate 1, a first power switching contact 5 and a second power switching contact 6. The gate control conductive trace 3 is enclosed by the Kelvin conductive trace 4. Such a surrounding arrangement of the Kelvin conductive trace 4 could reduce the electromagnetic interference on the gate control conductive trace 3.

Figure 11:
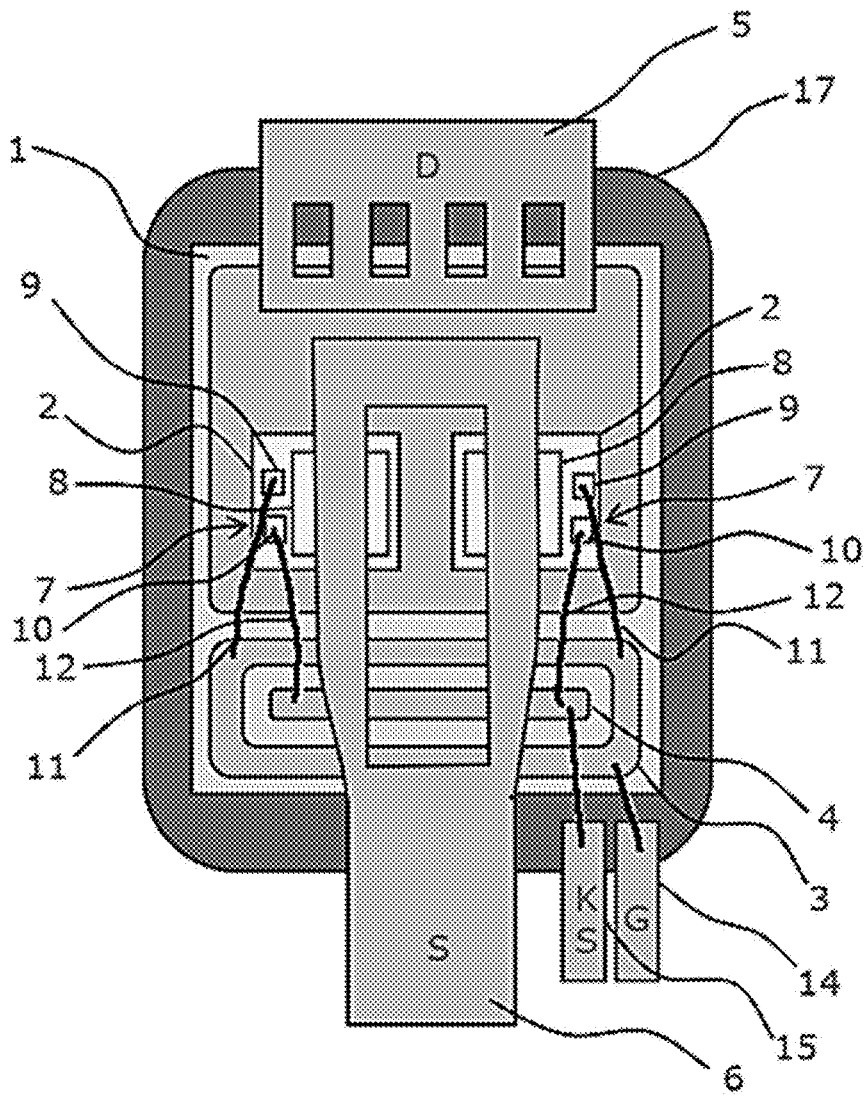
FIG. 11 shows a top view of a package structure for a power semiconductor device in another embodiment of the present disclosure.

FIG. 11 is a top view of another package structure for the power semiconductor device of the present disclosure. Unlike FIG. 10, the Kelvin conductive trace 4 shown in FIG. 11 is enclosed by the gate control conductive trace 3. Such a surrounding arrangement of the gate control conductive trace 3 could reduce the electromagnetic interference on the Kelvin conductive trace 4.

In the package structures for the power semiconductor devices shown in FIGS. 10 and 11, the bonding components (e.g. the bonding wires 11, 12) connecting each semiconductor die 2 to the gate control conductive trace 3 and the Kelvin conductive trace 4 are not sandwiched between the two circuit lines formed by the second power switching pad 8 of each semiconductor die 2 and the second power switching contact 6. The two gates 9 of the two semiconductor dies 2 are not located at the edges of the two neighboring sides of the two semiconductor dies 2.

In the package structures for the power semiconductor devices shown in FIGS. 10 and 11, a temperature sensor (not shown in FIGS. 10 and 11) could be disposed in the remaining area on the substrate, the temperature sensor and the semiconductor die are located on the same layer. The arrangement of the temperature sensor on the substrate 1 could monitor temperature change of the device such that the device can dissipate heat rapidly, and the service life of the device is improved.

In order to validate the improvement of the present disclosure, parasitic parameters between the package structure of the semiconductor device in the prior art and the package structure of the semiconductor device used in the present disclosure are compared by building 3D models. The parasitic inductance and parasitic resistance of the control loops are extracted by Ansys Q3D Extractor, as shown in Table 1 below, where die 1 and die 2 represent the left-hand die and right-hand die in each 3D model. In prior art 1 the power loop and the control loop are coupled, while in the other three modules the power loop and the control loop are not coupled. It can be seen from this simulation that: solution 1 and solution 2 of the present disclosure have better parasitic parameter matching between the two semiconductor dies compared with prior art 1 or prior art 2. The parasitic parameters in solution 2 of the present disclosure are lower than those in solution 1 of the present disclosure, low parasitic parameters could greatly increase the switching rate while inhibiting the conducted EMI.

TABLE 1

Comparison of parasitic parameters between the package
structure of the semiconductor device in the prior art and
the package structure of the semiconductor device in the
present disclosure

Figure 1:
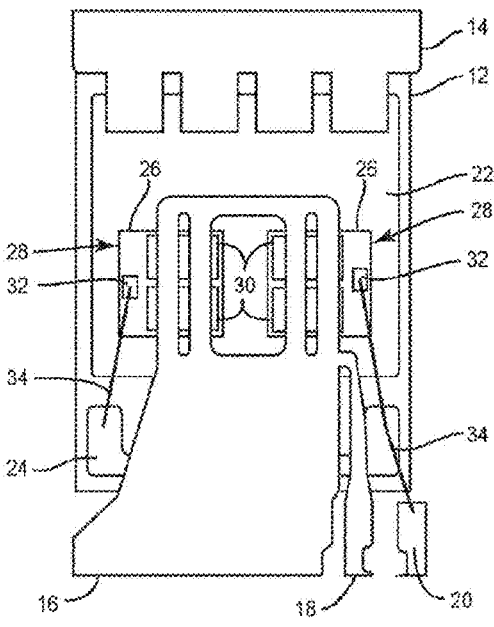
FIG. 1 shows a top view of a prior art package structure for a power electronic device.
Figure 2:
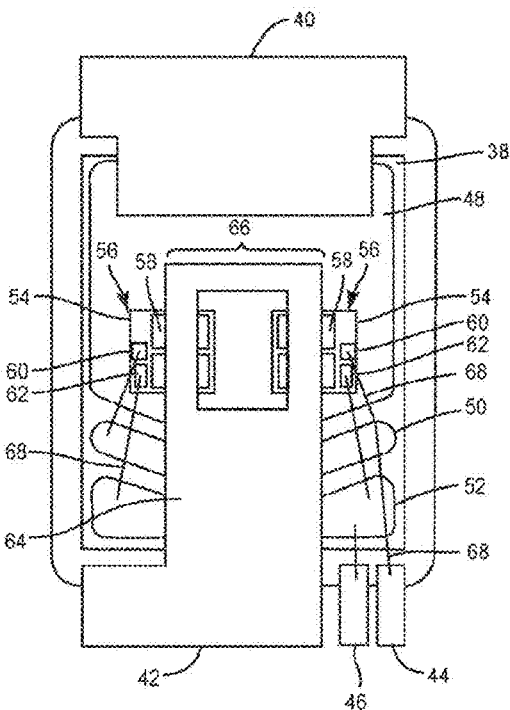
FIG. 2 shows a top view of another prior art package structure for a power electronic device.

| Module | Die | Parasitic inductance of the control loop [nH] | Parasitic resistance of the control loop [mohm] |
|---|---|---|---|
| Prior art 1 | Die 1 | 28.78 | 28.26 |
| (as illustrated in FIG. 1) | Die 2 | 23.96 | 27.83 |
| Prior art 2 | Die 1 | 33.12 | 33.33 |
| (as illustrated in FIG. 2) | Die 2 | 26.99 | 32.58 |
| Solution 1 in the | Die 1 | 29.71 | 37.80 |
| present disclosure | Die 2 | 29.14 | 38.51 |
| (as illustrated in FIG. 3) | | | |
| Solution 2 in the | Die 1 | 27.25 | 24.75 |
| present disclosure | Die 2 | 27.20 | 24.82 |
| (as illustrated in FIG. 5) | | | |

The package structure for the power semiconductor device provided in the present disclosure has an approximate control loop length for parallel power semiconductor dies, which brings approximate parasitic parameters/electrical impedances, thereby the problem of imbalanced switching/current of the parallel dies could be avoided. In addition, since the gate control conductive trace is enclosed by the Kelvin conductive trace, or the Kelvin conductive trace is enclosed by the gate control conductive trace, the present disclosure could have better anti-electromagnetic interference characteristics. Furthermore, the layout of the present disclosure could further save space on the substrate, so that a temperature sensor could be additionally arranged on the substrate to monitor the temperature of the power semiconductor device in time, so as to improve the service life of the device.

Finally, it should be noted that the above embodiments are only used to illustrate the technical solutions of the present disclosure, but not to limit the present disclosure; although the present disclosure has been described in detail with reference to the above embodiments, a skilled person in the art should understand that: the technical solutions described in the above embodiments can still be modified, or some or all of the technical features thereof can have equivalent substitutions, for example, the features of the dependent claims can be freely replaced and/or combined as required; and these modifications or substitutions do not essentially make the corresponding technical solutions departing from the scope of the technical solutions of the embodiments in the present disclosure.

List of reference numerals:

| Component | Reference numeral |
|---|---|
| Substrate | 1 |
| Semiconductor die | 2 |

-continued

List of reference numerals:

| Component | Reference numeral |
|---|---|
| Gate control conductive trace | 3 |
| Kelvin conductive trace | 4 |
| First power switching contact | 5 |
| Second power switching contact | 6 |
| First power switching pad | 7 |
| Second power switching pad | 8 |
| Gate | 9 |
| Kelvin connection pad | 10 |
| Bonding wire | 11, 12 |
| Temperature sensor | 13 |
| Gate signal contact | 14 |
| Kelvin signal contact | 15 |
| Temperature sensor signal contact | 16 |
| Plastic enclosure | 17 |
| Power switching conductive trace | 18 |

What is claimed is:

1. A package structure for a power semiconductor device, comprising:
a substrate;
two or more semiconductor dies on the substrate, each of the semiconductor dies comprises a first power switching pad, a second power switching pad and a gate;
a gate control conductive trace, a first power switching contact and a second power switching contact are disposed on the substrate; and
wherein the gate control conductive trace is connected to each of the semiconductor dies via a bonding component, and wherein the bonding component connecting a first semiconductor die to the gate control conductive trace is sandwiched between circuit lines formed by connecting the second power switching pads of the first semiconductor die and the neighboring second semiconductor die, to the second power switching contact of the substrate.

2. The package structure for the power semiconductor device of claim 1, wherein the bonding component is a bonding wire.

3. The package structure for the power semiconductor device of claim 1, wherein the bonding component is a copper clip.

4. The package structure for the power semiconductor device of claim 1, further comprising a Kelvin conductive trace that is disposed on the substrate, and wherein the bonding component connecting the first semiconductor die to the gate control conductive trace and the Kelvin conductive trace is sandwiched between circuit lines formed by connecting the second power switching pads of the first semiconductor die and the neighboring second semiconductor die, to the second power switching contact of the substrate.

5. The package structure for the power semiconductor device of claim 4, wherein each of the semiconductor dies further comprises a Kelvin connection pad and the gate, and wherein the Kelvin connection pad of each of the semiconductor dies are connected to the gate control conductive trace and the Kelvin conductive trace, respectively.

6. The package structure for the power semiconductor device of claim 4, wherein the Kelvin conductive trace is connected to the second power switching pad of each of the semiconductor dies via the bonding component.

7. The package structure for the power semiconductor device of claim 4, wherein the gate control conductive trace is enclosed by the Kelvin conductive trace, or the Kelvin conductive trace is enclosed by the gate control conductive trace.

8. The package structure for the power semiconductor device of claim 4, wherein the gate control conductive trace is located between the semiconductor die and the Kelvin conductive trace, or the Kelvin conductive trace is located between the semiconductor die and the gate control conductive trace.

9. The package structure for the power semiconductor device of claim 7, further comprising a temperature sensor that is further disposed on the substrate, and wherein the temperature sensor and the semiconductor die are located on the same layer.

10. The package structure for the power semiconductor device of claim 8, further comprising a temperature sensor that is further disposed on the substrate, and wherein the temperature sensor and the semiconductor die are located on the same layer.

11. The package structure for the power semiconductor device of claim 1, further comprising a Kelvin contact that is disposed on the substrate as an integral component with the second power switching contact.

12. The package structure for the power semiconductor device of claim 1, wherein when only two semiconductor dies are located on the substrate, the gates of the two semiconductor dies are disposed at edges of two neighboring sides of the two semiconductor dies, respectively.

13. The package structure for the power semiconductor device of claim 1, wherein the connection mode of the second power switching pad of each of the semiconductor dies to the second power switching contact of the substrate comprises bonding wire connection or metal contact.

14. A semiconductor device according to claim 1, wherein the first power switching pad is a drain or a receiver electrode, and the second power switching pad is a source or an emitter.

15. A power semiconductor device according to claim 1, wherein the first power switching contact is a drain contact, and the second power switching contact is a source contact.

16. The package structure for the power semiconductor device of claim 1, wherein the semiconductor die comprises a die selected from the group consisting of a IGBT die, a SiC die, and a GaN die.

17. A package structure for a power semiconductor device, comprising:
   a substrate;
   two or more semiconductor dies on the substrate, each of the semiconductor dies comprises a first power switching pad, a second power switching pad and a gate;
   a gate control conductive trace, a Kelvin conductive trace, a first power switching contact and a second power switching contact are disposed on the substrate; and
   wherein the gate control conductive trace is enclosed by the Kelvin conductive trace, or the Kelvin conductive trace is enclosed by the gate control conductive trace.

18. The package structure for the power semiconductor device of claim 17, further comprising a temperature sensor that is disposed on the substrate, and wherein the temperature sensor and the semiconductor die are located on the same layer.

19. The package structure for the power semiconductor device of claim 17, wherein the semiconductor die comprises a die selected from the group consisting of a IGBT die, a SiC die, and a GaN die.

* * * * *